(12) United States Patent
Skulina et al.

(10) Patent No.: US 6,521,101 B1
(45) Date of Patent: Feb. 18, 2003

(54) METHOD FOR FABRICATING BERYLLIUM-BASED MULTILAYER STRUCTURES

(75) Inventors: Kenneth M. Skulina, Livermore, CA (US); Richard M. Bionta, Livermore, CA (US); Daniel M. Makowiecki, Livermore, CA (US); Craig S. Alford, Tracy, CA (US)

(73) Assignee: The Regents of the University of California, Oakland, CA (US)

( * ) Notice: Subject to any disclaimer, the term of this patent is extended or adjusted under 35 U.S.C. 154(b) by 1397 days.

(21) Appl. No.: 08/762,572

(22) Filed: Dec. 9, 1996

Related U.S. Application Data

(62) Division of application No. 08/557,445, filed on Nov. 4, 1995, now abandoned.

(51) Int. Cl.⁷ .............................................. C23C 14/34
(52) U.S. Cl. .......................... 204/192.27; 204/192.15; 204/192.26
(58) Field of Search ....................... 204/192.12, 192.15, 204/192.26, 192.27, 298.07

(56) References Cited

U.S. PATENT DOCUMENTS

| | | | | |
|---|---|---|---|---|
| 3,871,326 A | * | 3/1975 | Kanda et al. ................. | 118/63 |
| 4,380,211 A | * | 4/1983 | Shinohara .......... | 204/298.07 X |
| 4,591,418 A | * | 5/1986 | Snyder .............. | 204/192.26 X |
| 5,153,898 A | * | 10/1992 | Suzuki et al. .................. | 378/34 |
| 5,272,744 A | * | 12/1993 | Itou et al. ...................... | 378/35 |
| 5,310,603 A | * | 5/1994 | Fukuda et al. ............... | 428/446 |
| 5,521,031 A | * | 5/1996 | Tennant et al. ........... | 378/34 X |

FOREIGN PATENT DOCUMENTS

| | | | | |
|---|---|---|---|---|
| JP | 2056568 | * | 3/1987 | ............ 204/298.07 |
| JP | 3032849 | * | 2/1988 | ............ 204/298.07 |

OTHER PUBLICATIONS

K. M. Skulina et al., Applied Optics, vol. 34, No. 19, p. 3727, "Molybdenum/Beryllium . . . Ultraviolet", Jul. 1, 1995.*

* cited by examiner

*Primary Examiner*—S. H. VerSteeg
(74) *Attorney, Agent, or Firm*—L. E. Carnahan; Alan H. Thompson

(57) ABSTRACT

Beryllium-based multilayer structures and a process for fabricating beryllium-based multilayer mirrors, useful in the wavelength region greater than the beryllium K-edge (111 Å or 11.1 nm). The process includes alternating sputter deposition of beryllium and a metal, typically from the fifth row of the periodic table, such as niobium (Nb), molybdenum (Mo), ruthenium (Ru), and rhodium (Rh). The process includes not only the method of sputtering the materials, but the industrial hygiene controls for safe handling of beryllium. The mirrors made in accordance with the process may be utilized in soft x-ray and extreme-ultraviolet projection lithography, which requires mirrors of high reflectivity (>60%) for x-rays in the range of 60–140 Å (60–14.0 nm).

17 Claims, 6 Drawing Sheets

US 6,521,101 B1

METHOD FOR FABRICATING BERYLLIUM-BASED MULTILAYER STRUCTURES

This is a Continuation Division of application Ser. No. 08/557,445 filed Nov. 4, 1995 now abandoned The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to x-ray mirrors, particularly to multilayer mirrors, and more particularly to a process for fabricating beryllium-based multilayer x-ray mirrors useful in the wavelength region greater than the beryllium K-edge (11.1 n).

In the past few years, much attention has been directed to the development of x-ray optical applications, such as x-ray microscopy, astronomy, and extreme ultraviolet (EUV) lithography (EUVL), also known as soft x-ray projection lithography (SXPL). The use of shorter wavelength radiation allows thinner lines to be etched in the photoresist, used to delineate features during integrated circuit manufacture. Reducing the line width (and hence the design rules) will make greater circuit densities and further miniaturization possible. EUVL is considered as a possible route to very-large-scale integrated circuit manufacturing with feature sizes of 0.1 μm and smaller. The key item, without which the EUVL technology would be impossible, is high-reflectance multilayer mirrors for wavelengths near 10–15 nm. Some proposed systems use as many as eight normal-incidence reflections between the source and the resist-coated wafer, and for this reason, high mirror reflectance is essential. An EUVL system requires normal incidence mirror maintaining reflectance greater than 60% for x-rays in the range of 6.0–14.0 nm (60–140 Å).

Until now, molybdenum/silicon (Mo/Si) mirrors have received the most attention for EUVL and they have emerged as the de-facto standard, because this combination shows high theoretical reflectance (~76%) with 13.0 nm (130 Å) illumination. Intense activity has been devoted to efforts to achieve a reflectance close to this theoretical value and to demonstrate the thermal, radiation, and time stability of the multilayers. Measured reflectances of 63–65% are now achieved routinely with the Mo/Si multilayer mirror system. Normal incidence reflectivity as high as 66% at 13.4 nm (134 Å) has been achieved using Mo/Si multilayer coatings, and this material combination is generally considered to be optimal for x-ray wavelengths above the Si L-absorption edge at 12.4 nm (124 Å).

While Mo/Si has been the de-facto standard for EUVL mirrors because it is relatively easy to deposit with sufficient peak reflectivity (~64%), this material system is limited to wavelengths longer than the silicon $L_{II-III}$ edge at 12.6 nm (126 Å). Researchers have designed their mirrors for the >130 Å (13.0 nm) wavelength region; however, some subsystems (e.g. photoresists) may require shorter wavelength radiation. The x-ray penetration depth is larger at shorter wavelengths, which can allow the use of single-layer resists in lithography.

As indicated above, there is a need for reflectivity mirrors below 130 Å (13.0 nm) in SXPL systems for practical industrial processes. Just below the silicon $L_{II-III}$ edge, beryllium-based multilayers show the highest theoretical peak reflectivity, but these multilayers are limited to wavelengths longer than 111 Å, 11.1 nm (Be K-edge). However, this 111–130 Å wavelength region is potentially useful and could allow a ~20 Å shift in the design wavelength for SXPL systems. The corresponding increase in photon energy should make current photoresist materials compatible with the photolithographic process.

There are other motivations for developing multilayer x-ray optics for operation at wavelengths shorter than 12.4 nm, where use of Mo/Si is no longer feasible. For example, in both astronomy and microscopy, imaging at shorter wavelengths can provide an improvement in optical resolution. In addition, the greater penetration depth at shorter wavelengths should allow the use of thicker specimens in microscopy.

The best neutron supermirrors currently in production are made of alternating layers of nickel (Ni) and titanium (Ti), with carbon (C) added to the Ni to eliminate heteroepitaxial growth. Reflectivities of 75–95% in the $0_C$–$20^C$ range are currently obtained from the Ni/C—Ti system. Also, titanium, beryllium (Ti—Be) multilayer systems have been considered as an alternative to the Ni/C—Ti system. The Ti—Be system makes for bilayer structures which have excellent neutron contrast, a necessary requirement of supermirror devices. Such a Ti—Be multilayer system is described in "Neutron Reflectivity Measurements of Titanium-Beryllium Multilayers," A. E. Munter et al., University of Illinois at Urbana-Champaign, Department of Nuclear Engineering, dated Jun. 23, 1995.

Since beryllium dust is considered toxic, very little work has been done in the beryllium-based multilayer area. Also, oxygen uptake has limited x-ray performance of previous work. However, recent efforts in the development of the present invention have overcome any technical problems and any industrial safety/industrial hygiene problems and developed a safe method to produce very pure beryllium films, with interfacial roughness comparable to or better than the Mo/Si systems. The pure beryllium films are produced by sputter deposition and the multilayer x-ray mirrors or optical structures are formed by a process which includes alternating sputter deposition of beryllium and a metal, typically from the fifth row of the periodic table. The present invention includes not only the method of sputtering the materials but also the industrial hygiene controls for safe handling of beryllium including confining of dust and fumes, and filtering to protect the environment. The beryllium-base multilayer structures, such as x-ray optics, of the present invention are particularly applicable for use in soft x-ray and extreme-ultraviolet projection lithography.

SUMMARY OF THE INVENTION

It is an object of the present invention to provide beryllium-based multilayer structure for x-ray mirrors.

A further object of the invention is to provide a multilayer mirror having alternating layers of high-Z material and low-Z material.

A further object of the invention is to provide a process for fabricating beryllium-based multilayer x-ray mirrors.

A further object of the invention is to provide beryllium-based multilayer x-ray mirrors useful in the wavelength region greater than the beryllium K-edge (111 Å).

Another object of the invention is to provide a process which includes alternating sputter deposition of beryllium and a metal, typically from the fifth row of the periodic table.

Another object of the invention is to provide a process for sputter deposition of beryllium-based multilayers which includes industrial hygiene controls for safe handling of beryllium.

Another object of the invention is to provide beryllium-based multilayer mirrors for soft x-ray and extreme-ultraviolet projection lithography.

Another object of the invention is to provide a process for fabricating beryllium-based multilayer mirrors with adequate reflectivity (~60%) for projection lithography.

Other objects and advantages of the invention will become apparent from the following description. The present invention involves beryllium-based multilayer structures which are particularly applicable for x-ray mirrors and a process for fabricating such multilayer structures. The beryllium-based multilayer x-ray mirrors are useful in the wavelength region greater than the beryllium K-edge (111 Å or 11.1 nm) and are thus useful for example, in soft x-ray projection lithography (SXPL), or extreme-ultraviolet lithography (EUVL) mirrors for soft x-ray synchrotron beamlines. The process includes alternating sputter deposition of a low atomic number (low Z) metal (beryllium) and a high atomic number (high Z) metal (typically from the fifth row of the periodic table), such as niobium, molybdenum, ruthenium, and rhodium. This invention includes not only the method of sputtering the materials but the industrial hygiene controls for safe handling of beryllium, since beryllium dust is considered toxic. The beryllium-based multilayer mirrors made in accordance with the present invention have a reflectivity (~65%) which is adequate for projection lithography, since SXPL and EUVL require mirrors of a reflectivity >60% for x-rays in the range of 60–140 Å (6.0–14.0 nm).

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

Figure 1:
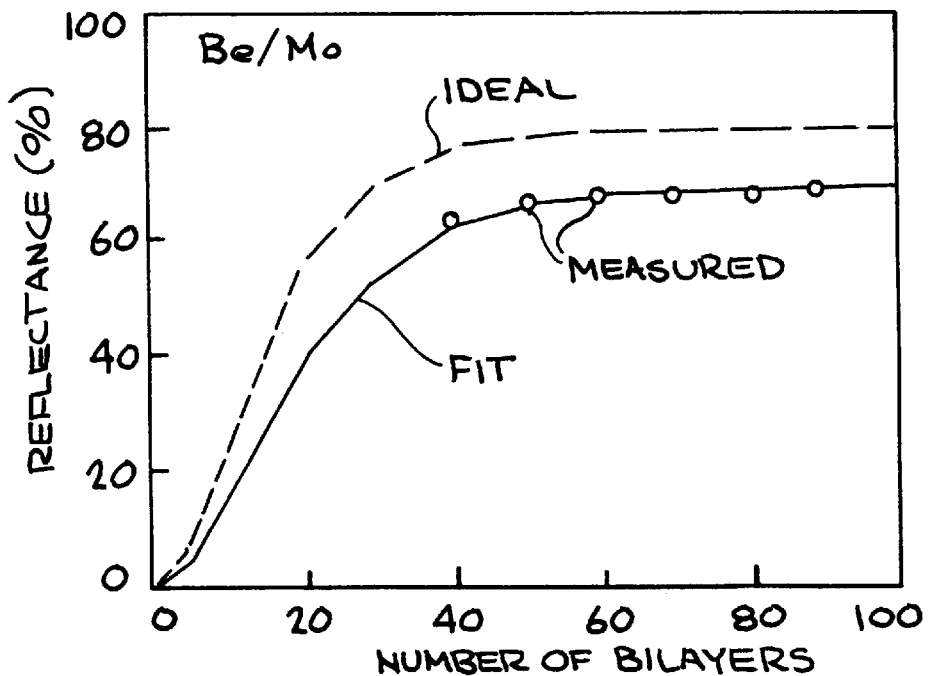
FIG. 1 is a graph illustrating the peak normal incidence reflectance for the molybdenum/beryllium mirror as a function of the number of bilayers.

The present invention is directed to beryllium-based multilayer structures for x-ray mirrors and to a process for fabricating the multilayer structures. The invention involves fabricating beryllium-based multilayer x-ray mirrors, useful in the wavelength region greater than the beryllium K-edge (111 Å or 11.1 nm). The process includes alternating sputter deposition of a low atomic number (low Z) material, such as beryllium (Be) and a high atomic number (high Z) metal (typically from the fifth row of the periodic table), such as molybdenum (Mo), ruthenium (Ru), rhodium (Rh), and niobium (Nb).

As pointed out above, molybdenum/silicon (Mo/Si) mirrors have been the de-facto standard for x-ray applications, such as used in SXPL and EUVL systems which require a reflectivity of >60% for x-rays in the range of 60–140 Å, since the Mo/Si mirror is relatively easy to deposit and has demonstrated sufficient peak reflectivity (~64%). However, the Mo/Si material is limited to wavelengths longer than the silicon L-absorption edge at 124–126 Å (12.4–12.6 nm). Mirrors have thus been designed for the >130 Å (13.0 nm) wavelength region. However, some subsystems (e.g. photoresists) require shorter wavelength radiation, and thus a need has existed for high reflectivity mirrors below 130 Å for SXPL systems for practical industrial processes. Just below the silicon L-absorption edge, beryllium-based multilayers show the highest theoretical peak reflectivity (~80%) at wavelengths above the beryllium K-edge at 111–112 Å (11.1–11.2 nm). Thus, this 111–130 wavelength region is potentially useful and could allow a~20 Å shift in the design wavelength for SXPL systems, for example. The corresponding increase in photon energy should make current photoresist materials compatible with the photolithographic process. Also, imaging at shorter wavelengths can provide an improvement in resolution. In addition, the x-ray penetration depth is larger at short wavelengths, which can allow the use or single-layer resists in lithography and thicker specimens in microscopy. Additionally, mirrors with demonstrated reflectances of 70% or greater could have a significant effect on EUV lithography. For example, an increase in peak reflectance from 65% to 70% would correspond to a factor of $(1.08)^8$ or an 80% net increase in photon throughput at the peak wavelength.

Wavelength considerations are of equal, if not greater, importance than reflectance considerations in EUVL. The Mo/Be multilayers have a peak reflectance near 11.4 nm, compared with the 13.0–13.5 nm peak of the currently favored Mo/Si multilayers. This 16% increase in the photon energy leads to an increase in the penetration depth (1/e) in prototypical high-resolution resists, e.g., PMMA, which increased from 0.24 to 0.34 m, thus allowing a thicker resist to be used. This could lead to a higher-contrast latent image in surface-imaging and near-surface-imaging resists, better etch resistance, higher sidewall angle, and lower defect density. In addition, the thicker penetration depth opens up the possibility of new resist technologies, e.g., bilayer schemes using new chemistry. In contrast with these potential advantages in resist development, the wavelength shift is not sufficiently significant to require major redesign of current optical systems. The introduction of these shorter-wavelength, high-reflectance mirrors may allow a complete EUVL system to be realized soon.

Table I shows potential material combinations at two discrete wavelengths, along with their theoretical reflectances and $\Gamma$=0.4. Mo/Si is the nearly universal choice above 13 nm, whereas Be-based multilayers are attractive between the Be—K-edge at 11.1 run and a wavelength is just longer than the Si L-edge at 12.4–12.6 nm.

TABLE I

| $\lambda$ = 11.4 nm | | $\lambda$ = 13.0 nm | |
| --- | --- | --- | --- |
| Tc/Be | 81 | Nb/Si | 77 |
| Ru/Be | 80 | Mo/Si | 76 |

TABLE I-continued

| λ = 11.4 nm | | λ = 13.0 nm | |
|---|---|---|---|
| Mo/Be | 80 | Tc/Si | 76 |
| Rh/Be | 78 | Ru/Si | 74 |
| Nb/Be | 78 | Tc/Be | 73 |
| Zr/Be | 73 | Nb/Be | 73 |
| Pd/Be | 73 | Mo/Be | 73 |
| B/Be | 71 | Ru/Be | 72 |

Experimental verification of the present invention was carried out using beryllium-based multilayer coatings composed of Mo/Be, Ru/Be, Rh/Be, and Nb/Be, which have theoretical normal incidence reflectivities of near 80% at wavelengths above the Be K-edge at 11.1–11.2 nm. The results on the structural characterization of the Be-based multilayer coatings showed significant variations in the microstructure of multilayer films of the different material systems produced by sputter deposition. It was found that the best layering is obtained for Mo/Be, where the Mo layers are crystalline, the Be layers are amorphous, and the interdiffusion is limited to a~1 nm-wide interlayer region. A near-normal incidence reflectivity of 68% at 11.4 nm for the Mo/Be multilayer was measured. The Ru/Be and the Rh/Be multilayers exhibit significant interdiffusion and compound formation. The Nb/Be multilayers with 50 bilayers, Γ=0.38, showed a relatively low reflectivity, 57.5±0.3% for multilayers ending in Be and 54.0±0.3% for multilayers ending in Nb. Thus, since the Mo/Be, Ru/Be, and Rh/Be multilayers performed better than the Nb/Be multilayers, further development and testing of the Nb/Be system was not continued, although Nb/Be multilayers may provide an acceptable alternate to other mirror systems. Initial experimental verification of the Mo/Be land Nb/Be multilayer systems is set forth in "Molybdenum/Beryllium Multilayer Mirrors for Normal Incidence in the Extreme Ultraviolet", K. M. Skulina et al., Applied Optics, Vol. 34, No. 19, Jul. 1, 1995, pp.3727–3730.

The multilayer coatings for the Mo/Be, Ru/Be, Rh/Be, and Nb/Be systems were deposited using dc magnetron sputtering in a cryopumped vacuum system using an argon (Ar) plasma discharge. The deposition system consisted of two 2-inch-diameter circular targets mounted vertically for sputtering in a sideways orientation and positioned a distance of 9–9.5 cm from the substrate surface. The sputtering targets and substrate were faced sideways to minimize debris. The substrates were mounted on a fixture that provided computer-controlled rotation between the two sources in a pendulum-like motion. Hence each layer of material was produced by passing the substrate twice in front of a source. In addition, the substrates were spun at a rate of 2 Hz throughout the deposition. The base pressure of the system was $5 \times 10^8$ Torr, and the nominal argon-sputtering pressure was 2.5 mTorr. The coatings were deposited on 3 inch (7.6 cm) diameter polished, single-crystal <110> silicon (Si) wafers having a ~2 nm overcoat of native oxide. Because Be dust is considered toxic, the face of the vacuum chamber was contained in a filtered enclosure. Table II summarizes the deposition conditions for representative samples of Mo/Be, Ru/Be, and Rh/Be, which were carried out following the initial deposition of Nb/Be. In Table II, the multilayer period is determined from high-resolution transmission electron microscopy (HREM) images using the Si (111) planes (d=0.3135 nm) of the substrate for calibration.

TABLE II

| Sample | Ar Pressure (mT) | Be Power (W) | Non-Be Power (W) | N | ML Period (nm) |
|---|---|---|---|---|---|
| Mo—Be M41 | 2.5 | 200 | 35 | 70.5 | 5.8 |
| Ru—Be M58 | 2.5 | 200 | 35 | 70.5 | 5.8 |
| Rh—Be M59 | 2.5 | 200 | 35 | 40.5 | 6.4 |

In the experimental verification of the Mo/Be multilayer, as set forth in the above-referenced Applied Optics article, the reflectance was measured at near-normal incidence (5 deg.) with a laser produced plasma source/reflector. The measurements were performed with one pulse per data point with an incident intensity of ~$10^5$ photons/pulse. The statistical uncertainty in the reflectance measurements is determined by the photon shot noise, and for a single measurement the relative rms uncertainty is ~0.7%. The uncertainty in the measured peak reflectance is smaller than this because several points are averaged. Nonuniformity in the response of the detector may lead to an error in the measured reflectance if the direct and the reflected beams strike different spots on the detector. For this reason a silicon photodiode (International Radiation Detectors AXUV-100) with excellent uniformity (better than 0.1% at 1.3 nm) was used for these measurements. A Be filter was used to eliminate the effects of any higher harmonics or scattered light from the mono-chromator. The beam size at the sample was ~1.0 mm×0.4 mm.

It is possible that O could become incorporated into the Be during sputtering or that the surface could become oxidized after exposure to air. To investigate this possibility, we deposited a 0.5 μm Be film on a Be substrate for Rutherford backscattering analysis. The analysis showed a 2.9 nm equivalent thickness of BeO on the surface and a nominal 0.1-at. % level in the bulk. We assume that the multilayer mirrors ending in Be have the same amount of O on the surface as that of this test film. The O level in the bulk of this film is the same as in the target material, within experimental error. We found from modeling that the postulated BeO reduces ideal reflectance by ~2%, independent of the number of layers.

FIG. 1 shows the peak normal-incidence reflectance for the Mo/Be multilayer system as a function of the number of bilayers N. The circles represent the measured data. The dashed curve is calculated for multilayers with ideal interfaces. The continuous curve through the data (circles) results from a numerical model. The model parameters were d=5.75 nm, Γ=0.45, 0.68 nm rms interface roughness, and 3.0 nm of BeO on the surface. The measured reflectances do not increase as rapidly with the number of bilayers as the model suggests. This could possibly be due to the increasing value of interfacial roughness with increasing thickness. The data level off at N=70 with R=67.5%. Also shown on this plot is a curve for ideal interfaces with no surface oxide. This curve asymptotically approaches R=78.1%. We found that the wavelength of peak reflectance changed by 0.3 nm from the center to the edge of the wafer, corresponding to a 0.15 nm d-spacing variation.

After determining that N=70 gave the maximum reflectance, we adjusted Γ to 0.36±0.02. The observed reflectance was 68.7±0.2%. This was the highest measured reflectance, and the reduced statistical uncertainty results from averaging more points at the wavelength of peak reflectance. We repeated this deposition onto a highly polished silicon wafer but found no improvement in reflectance.

Several of the films N, which ended in Be, were remeasured over the four-month duration of the experiments, and it was determined that there was no loss in measured reflectance, within experimental error. The films were stored in Fluoroware containers in ambient air.

Figure 2:
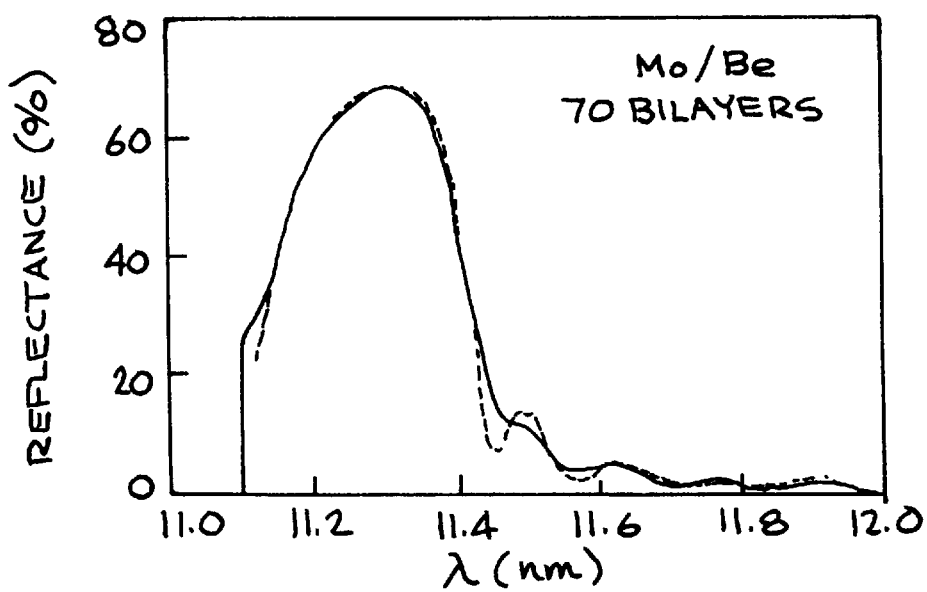
FIG. 2 is a graph illustrating the reflectance of a molybdenum/beryllium multilayer of 70 bilayers ending in beryllium.

FIG. 2 shows the reflectance of a Mo/Be multilayer, $\Gamma=0.36$, N=70, ending in Be. The measured peak reflectance is 68.7±0.2% at 11.3 nm (continuous curve). The dashed curve represents the modeled curve; the following parameters are used: d=5.72 nm, $\Gamma=0.36$, $\sigma=0.63$ nm, N=70, 3.0 nm BeO on the surface. Note that the d spacing that best simulates the measurements is 5.72 nm, which, with no refractive correction, would show a peak at 11.44 nm. The observed peak at 11.3 nm indicates the necessity of accounting for a refractive shift in the wavelength corresponding to peak reflectance. We find excellent agreement between the measured and simulated data.

Several other depositions to determine the effect of certain processing conditions on observed reflectance were tried, for example, a Be/Mo multilayer with N=40, $\Gamma=0.45$ that ended in Mo. Its reflectance was 58.0±0.3%, compared with 63.0±0.3% for the multilayer processed in identical conditions that ended with Be. We did not test for a time dependence of the reflectance of this Mo-ending multilayer. Such a phenomenon has been seen in Mo/Si multilayers ending in Mo.

We deposited a multilayer at a reduced sputtering pressure of 1.75 mTorr. We then adjusted the power supplies to give a multilayer spacing of approximately d=5.7 nm and $\Gamma=0.45$ to resemble the de positions shown in FIG. 1. For N=40 the reflectance was R=63.0±0.3%. Although the reflectance did not increase, much better uniformity over the 7.6-cm wafer was achieved, with the wavelength of peak reflectance being within 0.1 nm.

A modeling experiment was conducted to show how the integrated reflectance $R_{integ}$ compares with peak reflectance R between the Mo/Be and Mo/Si systems. Table III shows this comparison for an eight-bounce EUVL system, wherein there are eight normal-incidence reflections between the source and the resist-coated wafer.

TABLE III

| Parameter | Mo/Si | Mo/Be |
|---|---|---|
| N | 50.0 | 70.0 |
| d (nm) | 6.6 | 5.75 |
| $\Gamma$ | 0.36 | 0.36 |
| $\sigma$ (nm) | 0.65 | 0.65 |
| $R_{peak}$ | 0.031 | 0.048 |
| $R_{integ}$ | 0.044 | 0.058 |
| $\Delta E$ (eV) | 1.3 | 1.2 |
| $\Delta E/E$ | 0.0135 | 0.0110 |

After eight reflections the peak reflectance of Mo/Be is 55% greater than that of Mo/Si. The integrated reflectance increases by only 32% because of the narrower bandwidth of the Mo/Be. Thus the throughput gain in a lithography system resulting from the increased peak reflectance of Mo/Be depends on the relative bandwidths of the source and multilayers. Also, the smaller bandwidth of the Mo/Be system will impose greater constraints on the control of the d spacing for the eight reflection surfaces.

We observed a reflectance in near normal incidence of 68.7±0.2% at 11.3 nm for a Mo/Be multilayer with 70 periods, $\Gamma=0.36$, ending in Be. We believe that this is the highest normal incidence reflectance that has been attained for any material in the spectral range of 1–80 nm. For wavelengths longer than ~80 nm clean aluminum has a very high reflectance, and for wavelengths of less than ~1 nm there are perfect crystals that have peak reflectances approaching unity. This new multilayer combination with its higher reflectance and shorter peak wavelength may offer significant advantages over the Mo/Si combination for EUV projection lithography.

Following the above-described initial experiments relative to the Mo/Be multilayer (ML) coatings, additional experiments were carried out on Mo/Be, Ru/Be, and Rh/Be coatings to optimize the deposition conditions to minimize interfacial roughness and optimize peak reflectance. The bilayers were deposited in a number ranging from about 50 to 100 with 70 bilayers being the average (35 Be layers and 35 Mo layers, for example).

A detailed structural analysis of the ML coating, was performed using x-ray diffraction and high-resolution transmission electron microscopy (HREM). The x-ray diffraction measurements were made using a rotating anode source (CuK$\alpha$) at $\lambda=0.15412$ nm) with a double axis goniometer in the 0–20 configuration and a curved graphite crystal analyzer HREM was used to image the microstructure of the ML coatings using a JEOL 4000EX transmission electron microscope. Ultrathin cross-sectional specimens were prepared by a two step process of mechanical polishing and ion-beam milling described elsewhere.

The soft x-ray reflectivity of the ML coatings near normal incidence was measured using laser-produced plasma radiation and a vacuum reflectometer that has been described previously. All measurements were performed by scanning wavelength at a fixed angle of incidence 5.0 deg from the normal to the sample surface. The spot size of the x-ray beam was approximately 1 mm in diameter and the spectral resolution was 0.05 nm.

In addition to the fabrication of beryllium films, the present invention is concerned with the industrial hygiene controls for safe handling of beryllium. Thus, to carry out the fabrication method, it is necessary to confine, such as via a hooded enclosure, beryllium particles, dust and fumes to prevent contamination of the surrounding environment, and to provide an adequate air filtering arrangement, whereby only clean (beryllium free) air is discharged into the environment. The requirements and/or standards for handling and processing of beryllium have been well established and need not be described herein.

Results: Mo/Be

Figure 3A:
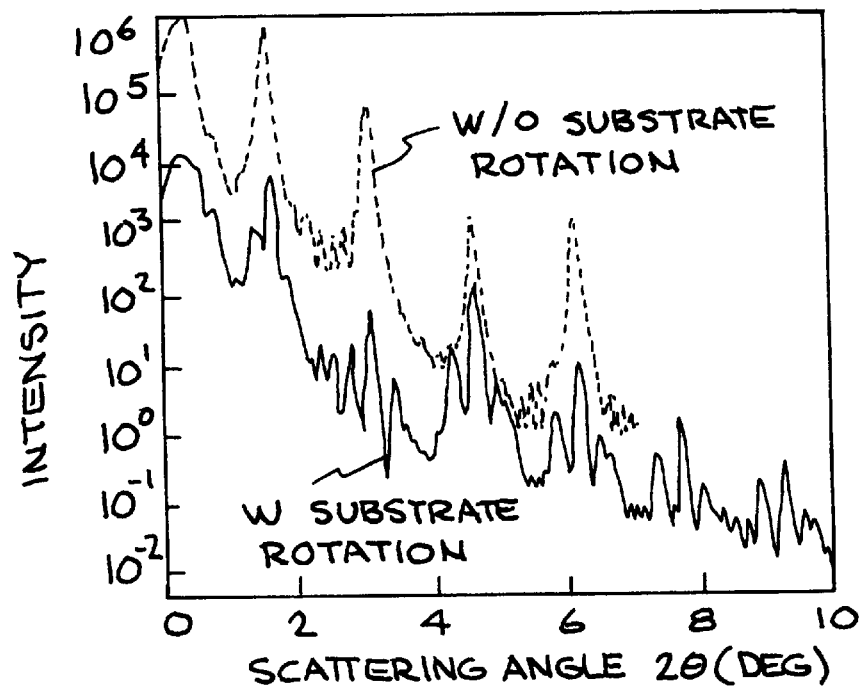
FIGS. 3A and 3B are graphs illustrating x-ray diffraction data measured from a molybdenum/beryllium multilayer.
Figure 3B:
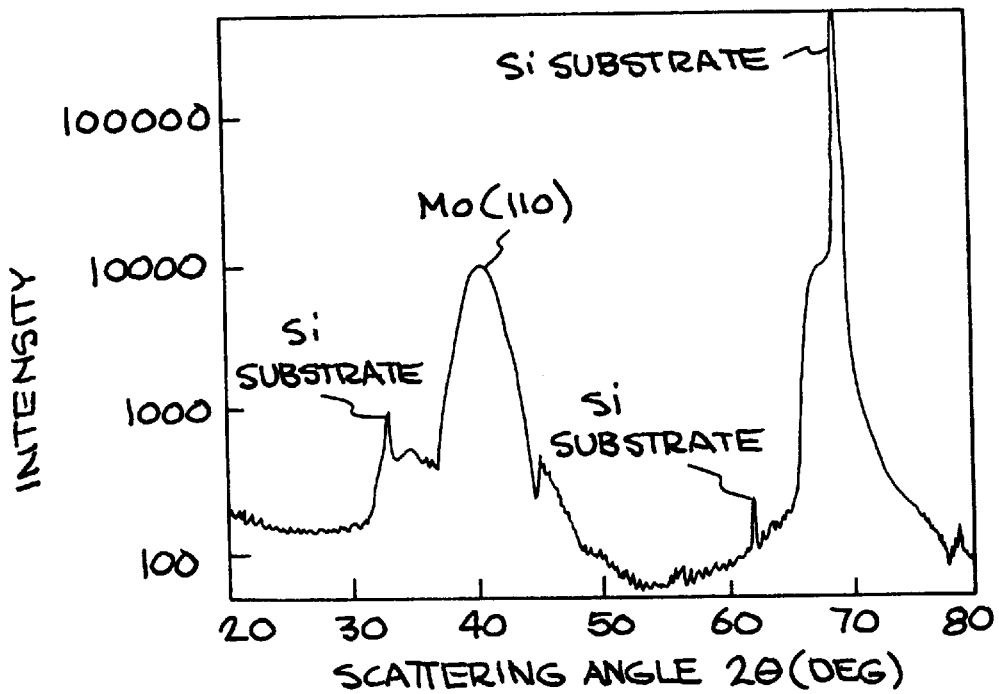

X-ray diffraction data measured from a Mo/Be ML sample are presented in FIGS. 3A and 3B. The small angle x-ray diffraction (SXRD), shown in FIG. 3A exhibits a series of strong diffraction orders, which is indicative of abrupt and smooth layer boundaries in the ML structure. Each order of diffraction is split into several peaks. This arises from an unintentional modulation of the ML period due to the compound motion of the substrate; the spinning and translational motions of the substrate are not locked in phase. Indeed, when the substrate spinning is turned off the splitting is absent, as shown by the dotted line in FIG. 3A. We estimate that the magnitude of the modulation of the ML period is ~0.2 nm. Hence the modulation should have a negligible effect on the optical performance of the coating. Large angle x-ray diffraction (LXRD) obtained from the Mo/Be ML sample is shown in FIG. 3B. The broad peak centered at 2$\theta$=40.50 deg corresponds to Mo (110). (There are several sharp features that are due to the crystalline Si substrate.) There is no evidence of a crystalline Be phase, and the Mo (110) peak does not exhibit the superlattice splitting that would be characteristic of a heteroepitaxial ML structure. The width of the Mo (110) peak corresponds to an average crystallite size in the growth direction of 2.56 nm.

Figure 4:
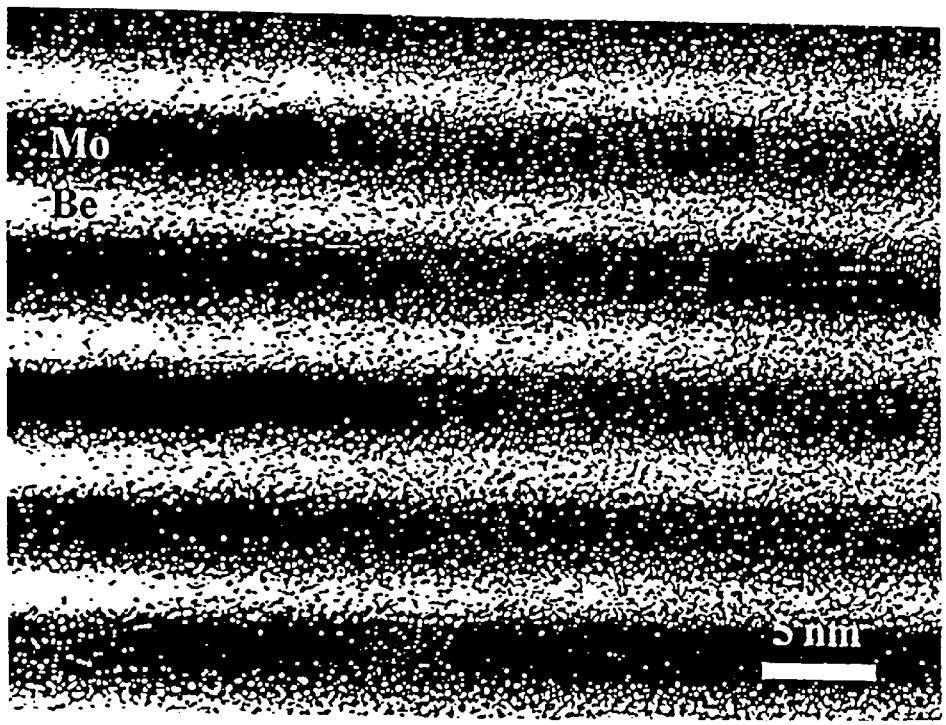
FIG. 4 is a cross-sectional HREM image of the molybdenum/beryllium multilayer microstructure.

The microstructure of the Mo/Be ML is shown in the HREM image of FIG. 4. The Si substrate, which is not shown, is always oriented below the figure. The Mo layers are polycrystalline and the Be layers are predominantly amorphous. The Mo crystallites are strongly textured, having a <110>orientation in the growth direction. The average thickness of the crystalline Mo layers is 2.6 nm (as calibrated using the atomic lattice of the Si substrate), which is in good agreement with the LXRD result. Thin, asymmetric interlayers of mixed composition are observable at the layer boundaries. The widths of the Mo-on—Be and Be—on-Mo interlayer regions are estimated to be 0.8 and 0.4 nm, respectively.

The measured reflectivity of the Mo/Be ML coating was plotted (see FIG. 2). The reflectivity peaks at 68% at a wavelength of 11.37 nm and has a spectral bandwidth of 0.32 nm full-width-at-half-maximum (FWHM). The measured reflectivity is compared to a calculation based on a ML structure of [Mo(2.64 nm)/Be(3.18 nm)]×70, shown as the dotted line in FIG. 2 where we use the observed interface widths of 0.8 and 0.4 nm and assume that these regions have linear composition variations. The calculation is based on bulk values for the mass densities and atomic scattering factors taken from published tables. The calculation significantly overestimates the reflectivity, predicting a peak value of 78%. This disagreement is probably due to a combination of two effects. First, the top Be layer oxidize s to form BeO which degrades the reflectivity due to the strong x-ray absorption of oxygen in this wavelength regime. Second, it is possible that the amorphous Be layers actually contain some Mo. We have modeled the reflectivity assuming that the composition of the Be layers is actually the Be-rich compound $Be_{12}Mo$. Using a ML structure of [$Be_{12}Mo$(31.8 nm)/Mo(2.64 nm)]×70+BeO(3.0 nm) we obtain the solid line plotted in FIG. 2.

Results Ru/Be

Figure 5A:
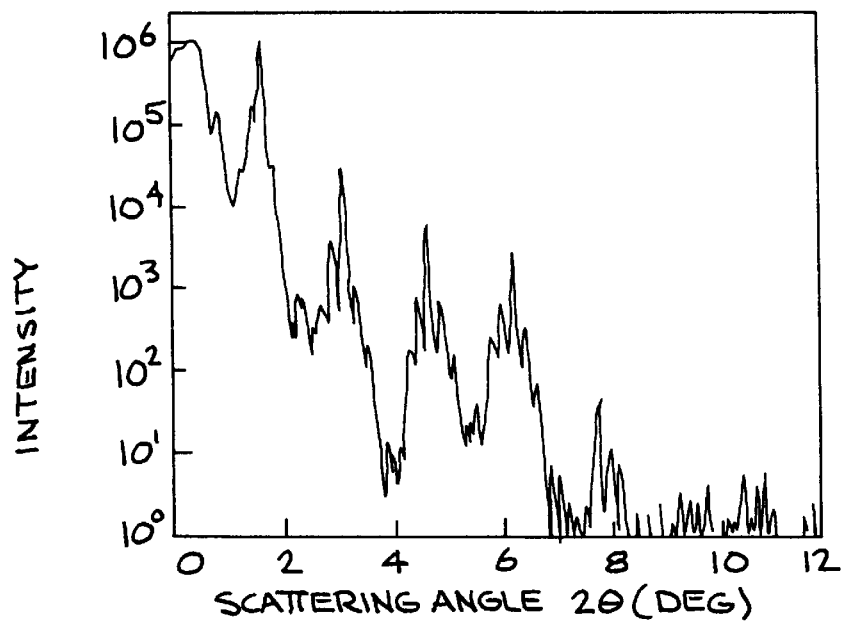
FIGS. 5A and 5B are graphs illustrating x-ray diffraction data measured from a ruthenium/beryllium multilayer.
Figure 5B:
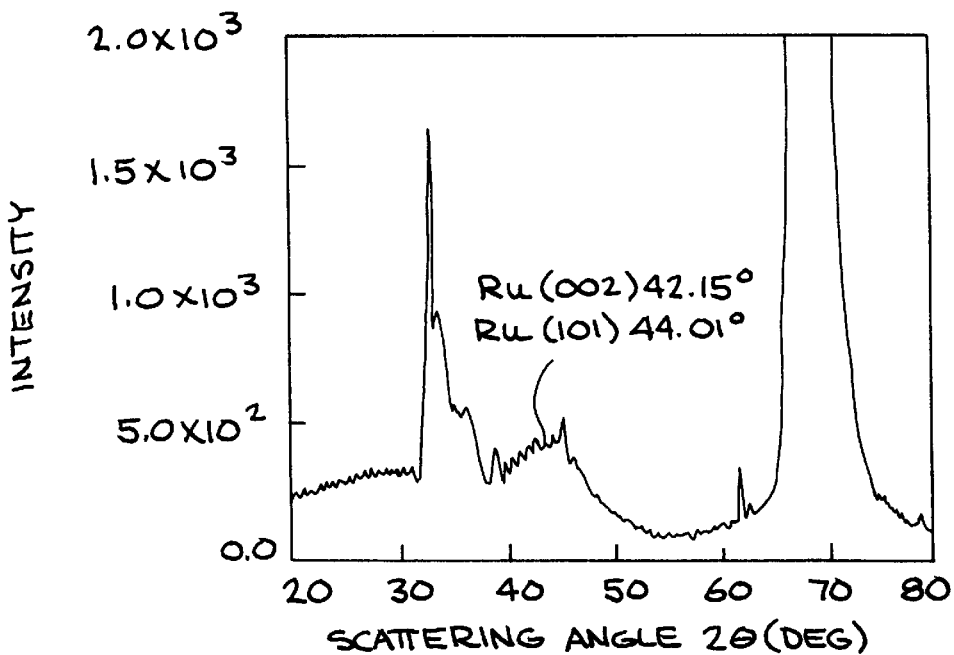

X-ray diffraction data measured from a Ru/Be ML sample are presented in FIGS. 5A and 5B. The SXRD shown in FIG. 5A exhibits five diffraction orders, indicating good layer formation with sharp layer boundaries. The LXRD, shown in FIG. 5B, presents no evidence of crystalline phases in the ML structure. There is a possible broad peak at 44 deg associated with amorphous Ru (the powder line of hcp Ru (101) is at 44.01 deg).

Figure 6:
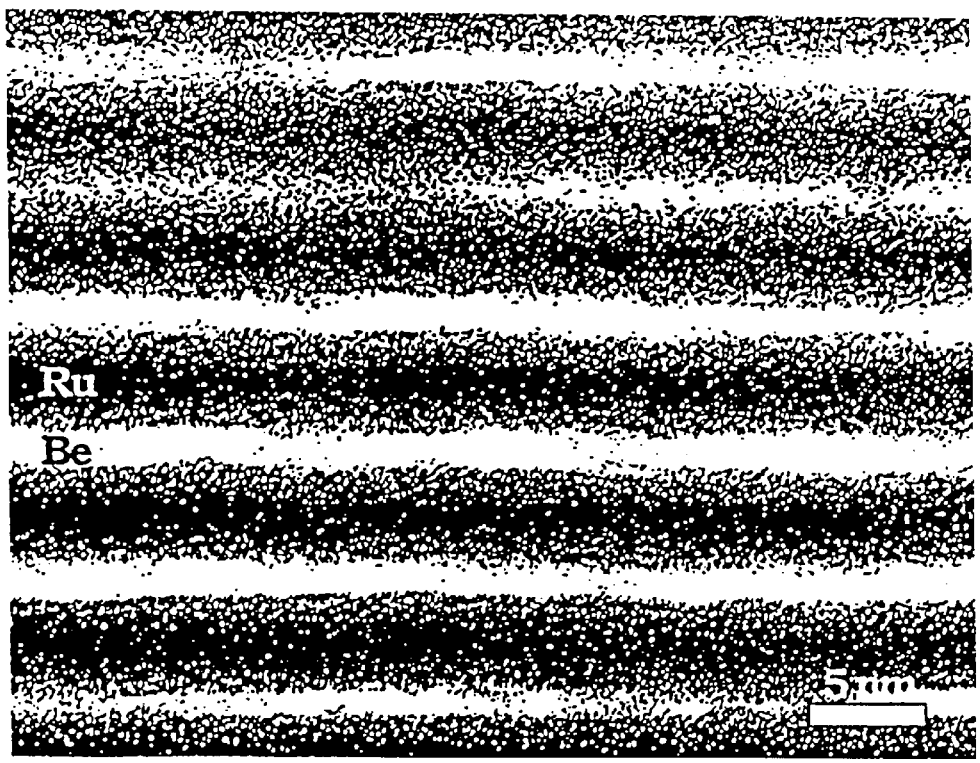
FIG. 6 is a cross-sectional HREM image of Fe ruthenium/beryllium multilayer microstructure.

An HREM image of the Ru/Be microstructure is shown in FIG. 6. There is no evidence of crystalline phases in either the Ru or Be layers. Extensive interdiffusion has taken place at the Ru layers to form wide, amorphous zones of mixed composition. The Ru concentration appears to increase towards the center of the zones, however, it is unclear whether the layers contain any region of pure Ru. There appear to be sharp reaction fronts between the interdiffused Ru layers and the unconsumed Be.

The near-normal incidence reflectivity was measured and found to have a peak value of 63% at a wavelength of 11.42 nm and a spectral bandwidth of 0.26 nm FWHM. This can be compared to a calculation based on an ideal ML structure of [Ru(2.65 nm)/Be(3.20 nm)]×170, which yields a peak reflectivity: of 77% and a bandwidth of 0.47 nm FWHM. The significant disagreement can be attributed to oxidation of the surface and reaction of the Ru layers, which lowers the optical contrast of the ML interfaces.

Results Rh/Be

Figure 7A:
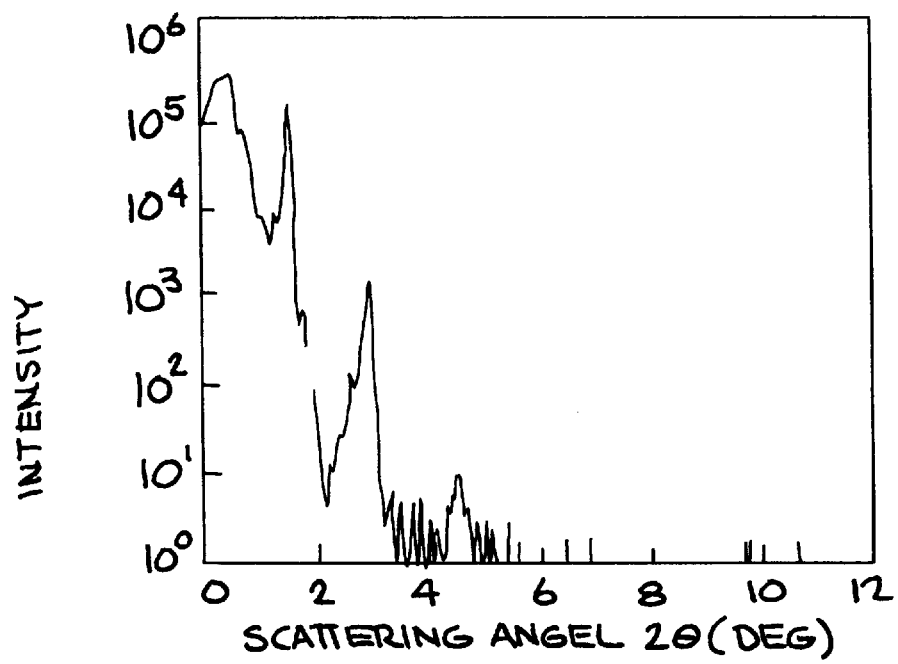
FIGS. 7A and 7B are graphs illustrating x-ray diffraction data measured from a rhodium/beryllium multilayer.
Figure 7B:
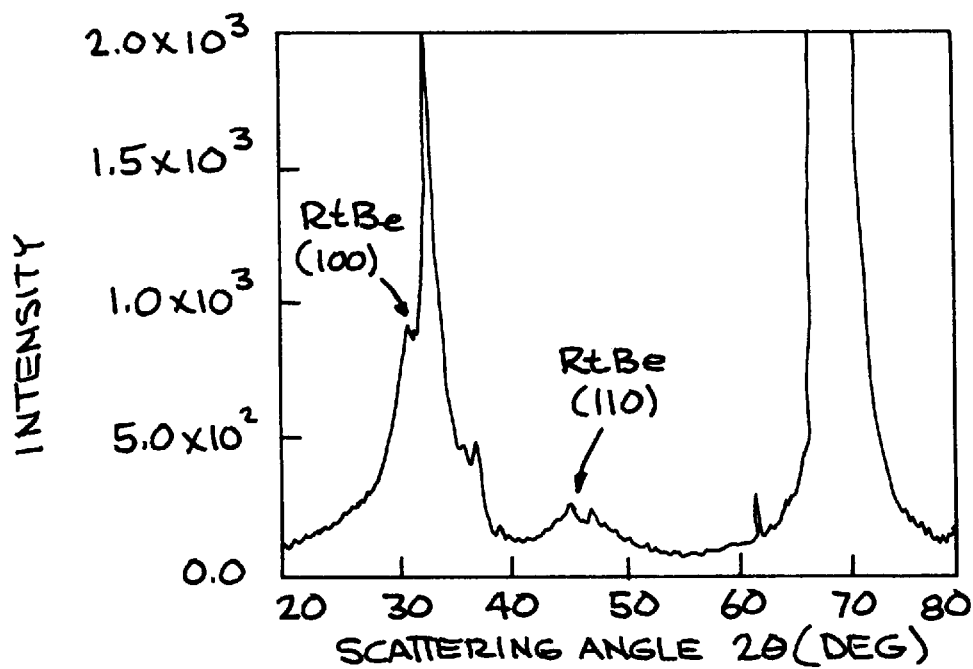

X-ray diffraction data measured from a Rh/Be ML sample are presented in FIGS. 7A–7B. This sample consisted of 40 layer pairs, as compared to the 70 layer pairs of the Mo—Be and Ru—Be samples. Only two orders of diffraction are observed in the SXRD shown in FIG. 7A, indicating significant roughness or diffusion at the layer boundaries. It was found that the layer structure degraded with increasing number of layers, motivating the use of fewer layers in the Rh/Be samples. The LXRD, shown in FIG. 7B, exhibits two features that are identified as the intermetallic compound RhBe, having the CsCl structure. The width of these features corresponds to an average crystallite size of 2.0 nm in the growth direction. There is no evidence of crystalline Rh or Be.

Figure 8:
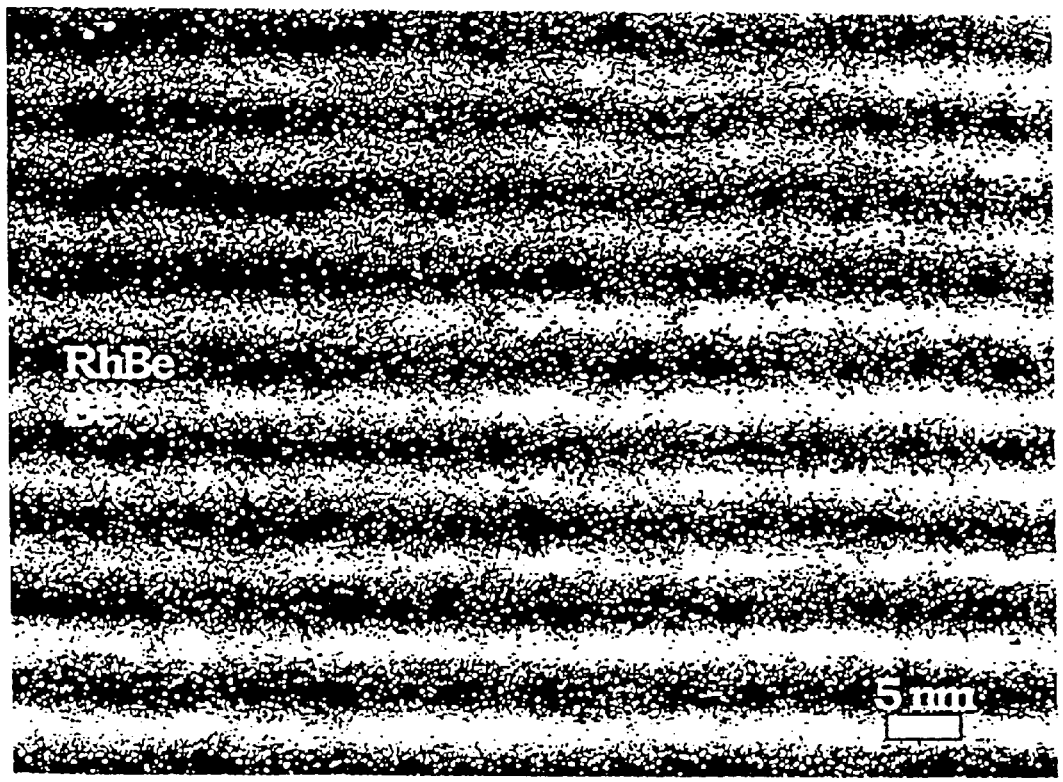
FIG. 8 is a cross-sectional HREM image of the rhodium/beryllium multilayer microstructure.

An HREM image of the Rh/Be microstructure is shown in FIG. 8. The Rh layers are observed to be completely reacted to form the RhBe intermetallic phase, consistent with the LXRD results. The RhBe layers are composed of small, randomly oriented crystallites. Be-rich regions separate the RhBe layers, and a layered structure is clearly evident in the image. However, the absence of oriented crystallinity in the RhBe layers results in significant interfacial roughness. Images over larger fields show that the roughness is partially conformal, increasing with distance from the substrate.

The near normal incidence reflectivity of the Rh/Be ML coating was measured to be 50% at 12.2 nm with a bandwidth of 0.38 nm FWHM. This can be compared to a calculation based on an ideal ML structure of [Rh(2.85 nm)/Be(3.50 nm)]×40, which yields a peak reflectivity of 63% and a bandwidth of 0.67 nm FWHM. We attribute the low value of the measured reflectivity to the observed compound formation and layer roughness, as well as oxidation of the surface.

It has thus been shown that the three ML systems of Mo/Be, Ru/Be, and Rh/Be exhibit very different growth behavior when deposited by magnetron sputtering. The Mo/Be ML structure is closest to the theoretical ideal structure of atomically smooth and compositionally abrupt layer boundaries. In contrast, interdiffusion occurs in the Ru/Be and Rh/Be systems which essentially consumes the pure Ru and Rh layers. The resulting microstructures are quite different in the two systems: the reaction produces amorphous layers of mixed composition having smooth interfaces in Ru/Be, and polycrystalline layers having rough interfaces in Rh/Be. Crystalline Be is not observed in any of the three systems. This is a somewhat surprising result since sputter deposition is a high energy process, and the low melting point (1278° C.) and simple close packed lattice of Be should favor crystallization. A possible explanation is that the "Be layers" are actually amorphous phases of the Be-rich intermetallic compound, either $Be_{12}Mo$, $Be_{12}Ru$, or $Be_{17}Rh_2$.

The measured x-ray optical performance correlates well with the microstructures of the three systems. Mo/Be yields a peak reflectivity of 68% at 11.4 nm. This is, to our knowledge, the highest normal incidence reflectivity at soft x-ray wavelengths measured to date. Interdiffusion and roughness at the layer boundaries results in lower reflectivities for Ru/Be and Rh/Be. Of these three ML systems, the Mo/Be system appears to hold the greatest promise for x-ray optical applications at wavelengths near 12 nm. There is a realistic prospect of achieving normal incidence reflectivity in excess of 70% by simply incorporating a passivation layer at the surface to inhibit oxidation. Another important issue for applications is the long-term stablility of Mo/Be ML coatings.

It has thus been shown that the present invention provides multilayer structures for x-ray mirrors composed of alternating layers of low-Z material and high-Z material, with the low Z-material being beryllium and the high-Z material being selected from the fifth row of the periodic table, preferably molybdenum, an Mo/Be multilayer structure. Experimental testing has also established the capability of producing other beryllium-based multilayers, such as Ru/Be, Rh/Be, and Nb/Be. It has also been shown that beryllium-based multilayer structures can be fabricated using magnetron sputter deposition, while providing safe handling of the beryllium. It has been shown that at least the Mo/Be, Ru/Be, and Rh/Be multilayer structures have a reflectivity of greater than 60% and thus find application in SXRL and EUVL systems, while reducing the wavelength to the 11.1–13.0 region, thereby providing for a 20 Å (2.0 nm) shift in the design wavelength for SXPL systems. The corresponding increase in photon energy should make current photoresist materials compatible with the photolithographic process. Since the process of the present invention overcomes the toxic beryllium dust problems, minimizes oxygen uptake during deposition, and sputters very pure beryllium films with interfacial roughness compared to or better than the Mo/Si system, the invention substantially advances the state of the art for fabricating x-ray mirrors from multilayer structures. Thus, the beryllium-based multilayer structure of this invention enables the fabrication of x-ray mirrors for use in SXPL and EUVL systems and having a reflectivity potential higher than the current Mo/Si system.

While particular embodiments of the multilayer structures have been described and/or illustrated and a specific operational process has been described for fabricating the multilayer structures, such are not intended to be limiting. Modifications and changes may become apparent to those skilled in the art, and it is intended that the scope of the invention be limited only by the scope of the appended claims.

What is claimed is:

1. A method for fabricating multilayer structures, comprising:
   providing a plurality of different sputter targets,
   providing a substrate,
   depositing on the substrate by dc magnetron sputter deposition alternating layers of beryllium and a metal from a sputter target selected from the metals of the fifth row of the periodic table, and
   providing filtering for preventing contamination by the beryllium of the surrounding environment whereby beryllium free air is discharged into the environment.

2. The method of claim 1, wherein the sputter deposition is carried out in an inert atmosphere.

3. The method of claim 1, wherein each layer is deposited by passing the substrate twice across a source.

4. The method of claim 1, additionally including rotating the substrate throughout deposition of the layers thereon.

5. The method of claim 1, additionally including positioning the substrate at a distance of about 9–9.5 cm from a sputter target source.

6. The method of claim 1, additionally including positioning the sputter targets vertically for sputtering in a sideways orientation.

7. The method of claim 1, additionally including providing means for confining any beryllium particles, dust and fumes prior to filtering.

8. A method for fabricating beryllium-based multilayer x-ray mirrors having a flexibility of at least 60%, comprising:
   providing a substrate,
   providing at least one sputter target containing beryllium,
   providing at least one sputter target selected from the group consisting of metals of the fifth row of the periodic table, and
   depositing on the substrate by dc magnetron sputter deposition alternating layers of beryllium and a metal from the fifth row of the periodic table,
   providing filtering for preventing contamination of the surrounding environment by the beryllium such that beryllium free air is discharged into the environment,
   whereby multilayer x-ray mirrors having a reflectivity of at least 60% are produced.

9. The method of claim 8, wherein the sputter deposition is carried out in an inert atmosphere.

10. The method of claim 8, wherein the deposited alternating layers are formed to comprise a multilayer composed of alternating layers selected from the group consisting of Mo/Be, Ru/Be, Rh/Be, and Nb/Be.

11. The method of claim 10, wherein the alternating layers are deposited to have a number of layers in the range of about 50 to about 100.

12. The method of claim 8, wherein providing the at least one sputter target of metal is carried out by forming sputter targets selected from the group consisting of molybdenum, ruthenium, rhodium, and niobium.

13. The method of claim 8, wherein the sputter targets of metal are selected such that the alternating layers deposited produce a reflectivity in the range of 60–70%.

14. The method of claim 8, additionally including selecting a metal sputter target of molybdenum, and carrying out the depositing of alternating layers of beryllium and molybdenum to produce a multilayer thereof.

15. The method of claim 14, wherein the alternating layers are deposited to a number of layers in the range of 50–100 and so as to produce a reflectivity of greater than 65.

16. A method for fabricating multilayer structures, comprising:
   providing a plurality of different sputter targets selected from the group consisting of beryllium, molybdenum, ruthenium, rhodium and niobium, and depositing alternating layers from the sputter targets by dc magnetron sputtering in an inert atmosphere to form a beryllium-based multilayer structure, and
   providing filtering for preventing contamination of the surrounding environment by the beryllium whereby only beryllium free air is discharged into the environment.

17. The method of claim 16, wherein the depositing is carried out to produce alternating layers in the range of about 50 to about 100 to produce a reflectivity of at least 60%.

* * * * *